(12) United States Patent
Bryant et al.

(10) Patent No.: US 6,968,487 B1
(45) Date of Patent: Nov. 22, 2005

(54) USER AVAILABLE BODY SCAN CHAIN

(75) Inventors: Ian Bryant, Sunnyvale, CA (US);
Chung-Yuan Sun, San Jose, CA (US);
Sheng Feng, Cupertino, CA (US);
Jung-Cheun Lien, San Jose, CA (US);
Stephen Chan, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 425 days.

(21) Appl. No.: 10/071,262

(22) Filed: Feb. 7, 2002

Related U.S. Application Data

(63) Continuation-in-part of application No. 09/654,240, filed on Sep. 2, 2000, now Pat. No. 6,476,636.

(51) Int. Cl.[7] .......................... G01R 31/28; G06G 7/48; H03K 17/693
(52) U.S. Cl. .............................. 714/726; 703/4; 716/16
(58) Field of Search ............................... 717/724–728, 717/729, 734, 735; 703/15–16; 716/4–5

(56) References Cited

U.S. PATENT DOCUMENTS

| | | | |
|---|---|---|---|
| 5,469,003 A | 11/1995 | Kean ........................... 326/39 |
| 5,483,178 A | 1/1996 | Costello et al. ............... 326/41 |
| 5,485,103 A | 1/1996 | Pedersen et al. .............. 326/41 |
| 5,491,353 A | 2/1996 | Kean ........................... 257/208 |
| 5,504,439 A | 4/1996 | Tavana .......................... 326/3 |
| 5,521,529 A | 5/1996 | Agrawal et al. ............... 326/41 |
| 5,528,176 A | 6/1996 | Kean ........................... 326/105 |
| 5,537,057 A | 7/1996 | Leong et al. ................. 326/41 |
| 5,541,530 A | 7/1996 | Cliff et al. ..................... 326/41 |
| 5,570,041 A | 10/1996 | El-Avat et al. ................ 326/41 |
| 5,572,712 A * | 11/1996 | Jamal ........................... 716/18 |
| 5,598,109 A | 1/1997 | Leong et al. .................. 326/41 |
| 5,606,266 A | 2/1997 | Pedersen ....................... 326/41 |
| 5,606,267 A | 2/1997 | El Ayat et al. ................. 326/41 |
| 5,614,840 A | 3/1997 | McClintock et al. .......... 326/41 |
| 5,617,042 A | 4/1997 | Agrawal ....................... 326/39 |
| 5,668,771 A | 9/1997 | Cliff et al. ............. 365/230.03 |
| 5,671,432 A | 9/1997 | Bertolet et al. ............. 395/800 |
| 5,682,107 A | 10/1997 | Tavana et al. ................. 326/41 |
| 5,689,195 A | 11/1997 | Cliff et al. ..................... 326/41 |
| 5,761,099 A | 6/1998 | Pedersen ............... 364/716.01 |

(Continued)

FOREIGN PATENT DOCUMENTS

EP  0 415 542 A2  3/1991  ........ H03K 19/173

OTHER PUBLICATIONS

"Methods for Boundary Scan Access of Built-in Self-test for Field Programmable Gate Arrays" Hamilton et al. IEEE Southeastcon '99 Proceedings Mar. 25-28, 1999. pp. 210-216 Inspec Accession No.: 6422210.*

(Continued)

Primary Examiner—Albert Decady
Assistant Examiner—Cynthia Britt
(74) Attorney, Agent, or Firm—Sierra Patent Group, Ltd.

(57) ABSTRACT

A method of accessing the testing means in a Field Programmable Gate Array ("FPGA") comprised of a plurality of functional groups ("FGs") comprising: inputting a function netlist defining a user circuit; compiling said function netlist; and generating a logic Built-In Self Test ("BIST") netlist; wherein said BIST netlist replaces all user registers with scan registers with a scan chain routed as the physical silicon scan chains.

6 Claims, 13 Drawing Sheets

U.S. PATENT DOCUMENTS

| | | | | |
|---|---|---|---|---|
| 5,764,583 | A | 6/1998 | Cliff et al. | 365/230.03 |
| 5,828,229 | A | 10/1998 | Cliff et al. | 326/40 |
| 5,878,051 | A * | 3/1999 | Sharma et al. | 714/724 |
| 5,977,793 | A | 11/1999 | Reddy et al. | 326/41 |
| 6,181,162 | B1 | 1/2001 | Lytle et al. | 326/41 |
| 6,211,697 | B1 | 4/2001 | Lien et al. | 326/41 |
| 6,301,688 | B1 * | 10/2001 | Roy | 716/4 |
| 6,463,560 | B1 * | 10/2002 | Bhawmik et al. | 714/733 |
| 6,550,030 | B1 * | 4/2003 | Abramovici et al. | 714/725 |
| 6,631,487 | B1 * | 10/2003 | Abramovici et al. | 714/725 |
| 6,681,354 | B2 * | 1/2004 | Gupta | 714/725 |

OTHER PUBLICATIONS

"Iterative Improvement Based Multi-way Netlist Partitioning for FPGAs" Krupnova et al. This paper appears in: Design, Automation and Test in Europe Conference and Exhibition Proceedings Mar. 9-12, 1999 pp. 587-594 Inspec Accession No.: 6390095.*

"Layout-Driven High Level Synthesis for FPGA Based Architectures" Xu et al. Design, Automation and Test in Europe Proceedings Feb. 23-26, 1998 pp. 446-450 Inspec Accession No.: 5906838.*

"Boundary Scan Access of Built-in Self-test for Field Programmable Gate Arrays" Gibson et al. IEEE International ASIC Conference and Exhibit, Date: Sep. 7-10, 1997 pp. 57-61 Inspec Accession No.: 5774208.*

"VariCore™ Embedded Programmable Gate Array Core (EPGA™) 0.18μm Family", Actel Corp. Data Sheet, 15 pages, Dec. 2001.

"Welcome to VariCore's website", [Internet] http://www.actel.com/varicore/index3.html first visited in Feb. 2001, printed Jul. 3, 2003, Actel Corp., 1 page.

"Overview", Internet0 *http://actel.com/varicore/about.index.html*, first visited in Feb. 2001, printed Jul. 3, 2003, Actel Corp., 3 pages.

"Products-VariCore", [Internet] http://actel.com/varicore/products/index.html, first visited in Feb. 2001, printed Jul. 3, 2003, Actel Corp., 2 pages.

"Documentation", [Internet] http://actel.com/varicore/support/index.html first visited in Feb. 2001, printed Jul. 3, 2003, Actel Corp., 1 page.

"Design Alliance", [Internet] http://actel.com/varicore/alliances/index.html, first visited in Feb. 2001, printed Jul. 3, 2003, Actel Corp., 1 page.

"Press Releases", [Internet] http://actel.com/varicore/press/index.html, first visited in Feb. 2001, printed Jul. 3, 2003, Actel Corp., 1 page.

"Contact Info", [Internet] http://actel.com/varicore/contact/index.html, first visited in Feb. 2001, printed Jul. 3, 2003, Actel Corp., 1 page.

"Market & General FAQ", [Internet] http://actel.com/varicore/about/FAQs.html, first visited in Feb. 2001, printed Jul 3, 2003, Actel Corp. 3 pages.

I. Bryant et al., "The Actel Embeddable FPGA Core", Internet published at http://www.actel.com/varicore/support//index.html first visited in Feb. 2001, printed Jul. 5, 2003.

* cited by examiner

User Logic: Implemention of AND OR Circuit and Register

DSER Logic - with Scan Superimposed

USER AVAILABLE BODY SCAN CHAIN

CROSS-REFERENCE TO RELATED APPLICATIONS

This application is a continuation-in-part of patent application Ser. No. 09/654,240, filed Sep. 2, 2000, now U.S. Pat. No. 6,476,636 entitled "Tileable Field-Programmable Gate Array Architecture", by Jung-Cheun Lien.

BACKGROUND OF THE INVENTION

1. Field of the Invention

The present invention relates to scan chains in field programmable gate arrays, and more specifically to making scan chains available to the end user.

2. Background of the Invention

A field-programmable gate array (FPGA) is an integrated circuit (IC) that includes a two-dimensional array of general-purpose logic circuits, called cells or logic blocks, whose functions are programmable. The cells are linked to one another by programmable buses. The cell types may be small multifunction circuits (or configurable functional blocks or groups) capable of realizing all Boolean functions of a few variables. The cell types are not restricted to gates. For example, configurable functional groups typically include memory cells and connection transistors that may be used to configure logic functions such as addition, subtraction, etc., inside of the FPGA. A cell may also contain one or two registers or flip flops. Two types of logic cells found in FPGAs are those based on multiplexers and those based on programmable read only memory (PROM) table-lookup memories. Erasable FPGAs can be reprogrammed many times. This technology is especially convenient when developing and debugging a prototype design for a new product and for small-scale manufacture.

FPGAs typically include a physical template that includes an array of circuits, sets of uncommitted routing interconnects, and sets of user programmable switches associated with both the circuits and the routing interconnects. When these switches are properly programmed (set to on or off states), the template or the underlying circuit and interconnect of the FPGA is customized or configured to perform specific customized functions. By reprogramming the on-off states of these switches, an FPGA can perform many different functions. Once a specific configuration of an FPGA has been decided upon, it can be configured to perform that one specific function.

The user programmable switches in an FPGA can be implemented in various technologies, such as ONO antifuse, M—M antifuse, SRAM memory cell, Flash EPROM memory cell, and EEPROM memory cell. FPGAs that employ fuses or antifuses as switches can be programmed only once. A memory cell controlled switch implementation of an FPGA can be reprogrammed repeatedly. In this scenario, an NMOS transistor is typically used as the switch to either connect or disconnect two selected points (A, B) in the circuit. The NMOS' source and drain nodes are connected to points A, B respectively, and its gate node is directly or indirectly connected to the memory cell. By setting the state of the memory cell to either logical "1" or "0", the switch can be turned on or off and thus point A and B are either connected or disconnected. Thus, the ability to program these switches provides for a very flexible device.

FPGAs can store the program that determines the circuit to be implemented in a RAM or PROM on the FPGA chip. The pattern of the data in this configuration memory CM determines the cells' functions and their interconnection wiring. Each bit of CM controls a transistor switch in the target circuit that can select some cell function or make (or break) some connection. By replacing the contents of CM, designers can make design changes or correct design errors. The CM can be downloaded from an external source or stored on-chip. This type of FPGA can be reprogrammed repeatedly, which significantly reduces development and manufacturing costs.

In general, an FPGA is one type of programmable logic device (PLD), i.e., a device that contains many gates or other general-purpose cells whose interconnections can be configured or "programmed" to implement any desired combinational or sequential function. As its name implies, an FPGA is "field-programmable", meaning that the device is generally programmed by designers or end users "in the field" via small, low-cost programming units. This is in contrast to mask programmable devices which require special steps in the IC chip-manufacturing process.

A field-programming unit typically uses design software to program the FPGA. The design software compiles a specific user design, i.e., a specific configuration of the programmable switches desired by the end-user, into FPGA configuration data. The design software assembles the configuration data into a bit stream, i.e., a stream of ones and zeros, that is fed into the FPGA and used to program the configuration memories for the programmable switches. The bit stream creates the pattern of the data in the configuration memory CM that determines whether each memory cell stores a "1" or a "0". The stored bit in each CM controls whether its associated transistor switch is turned on or off. End users typically use design software to test different designs and run simulations for FPGAs.

Designers of FPGAs (as well as other PLDs) often provide their circuit designs to IC manufacturers who typically manufacture the FPGAs in two different ways. First, an FPGA design may be manufactured as its own chip with no other devices being included in the IC package. Second, an FPGA design may be embedded into a larger IC. An example of such a larger IC is a system on a chip (SOC) that includes the embedded FPGA as well as several other components. The several other components may include, for example, a microprocessor, memory, arithmetic logic unit (ALU), state machine, etc. In this scenario the embedded FPGA may be only a small part of the whole SOC.

Whether a FPGA is to be manufactured as its own IC or embedded into a larger IC (e.g. a SOC), the intended application/use of the IC will determine the size and complexity of the FPGA that is needed. Because conventional FPGAs are typically designed for their intended application/use, an FPGA designed to fulfill a need for a small FPGA must be substantially redesigned for use where a larger FPGA is needed.

A FPGA array logic structure may also contain scan chains which are implemented by the FPGA manufacturer for manufacturing tests. These tests are performed to test the circuitry in the FPGA logic structure. More specifically, the scan chains implement a full scan of all the registers in the FPGA array. In the past, if the FPGA user had a requirement to implement a scan on his application circuit, he would insert an additional scan chain that uses the FPGA logic resources to create the scan chain. This would require an additional three input function. For example, a simple multiplexer would be implemented in front of every register. This leads to a significant area and performance impact.

Hence, there is a need for a device and method which will provide access for the user to the scan chain previously available only to the manufacturer. Therefore, it would be highly advantageous to the user to have a means of access to the scan chains previously available only to the manufacturer. This would enable the user to implement a scan on his application circuit and thus, a full scan of all the registers in the FPGA logic structure.

BRIEF SUMMARY OF THE INVENTION

The present invention provides a method and apparatus for accessing the scan chains within a FPGA. An FPGA contains basic building blocks called functional groups (FGs) which are made up of look-up tables (LUTS) and registers. Scan chains, invisible to the end user, are available only to the manufacturer to test the registers within a functional group.

The present invention provides a method of accessing the testing means in a FPGA comprised of a plurality of functional groups by inputting a function netlist, then compiling the function netlist and finally, generating a Built-In Self Test ("BIST") netlist. The BIST netlist overlays the users circuit with the FPGA scan chains and thus providing access to scan chains. The BIST syndrome is then calculated, generating actual values. The expected values are then compared with the actual values.

The apparatus of the present invention accesses the testing resources in a programmed FPGA employing internal scan chains by generating a BIST netlist, extracting one or more scan chains from the BIST netlist and predicting an expected syndrome value. The apparatus of the present invention then uses the scan chain to FPGA and obtains actual syndrome values. Finally, the apparatus of the present invention allows the user to compare the expected syndrome values with the actual syndrome values to determine whether the circuit is functioning correctly.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE DRAWINGS

Figure 1:
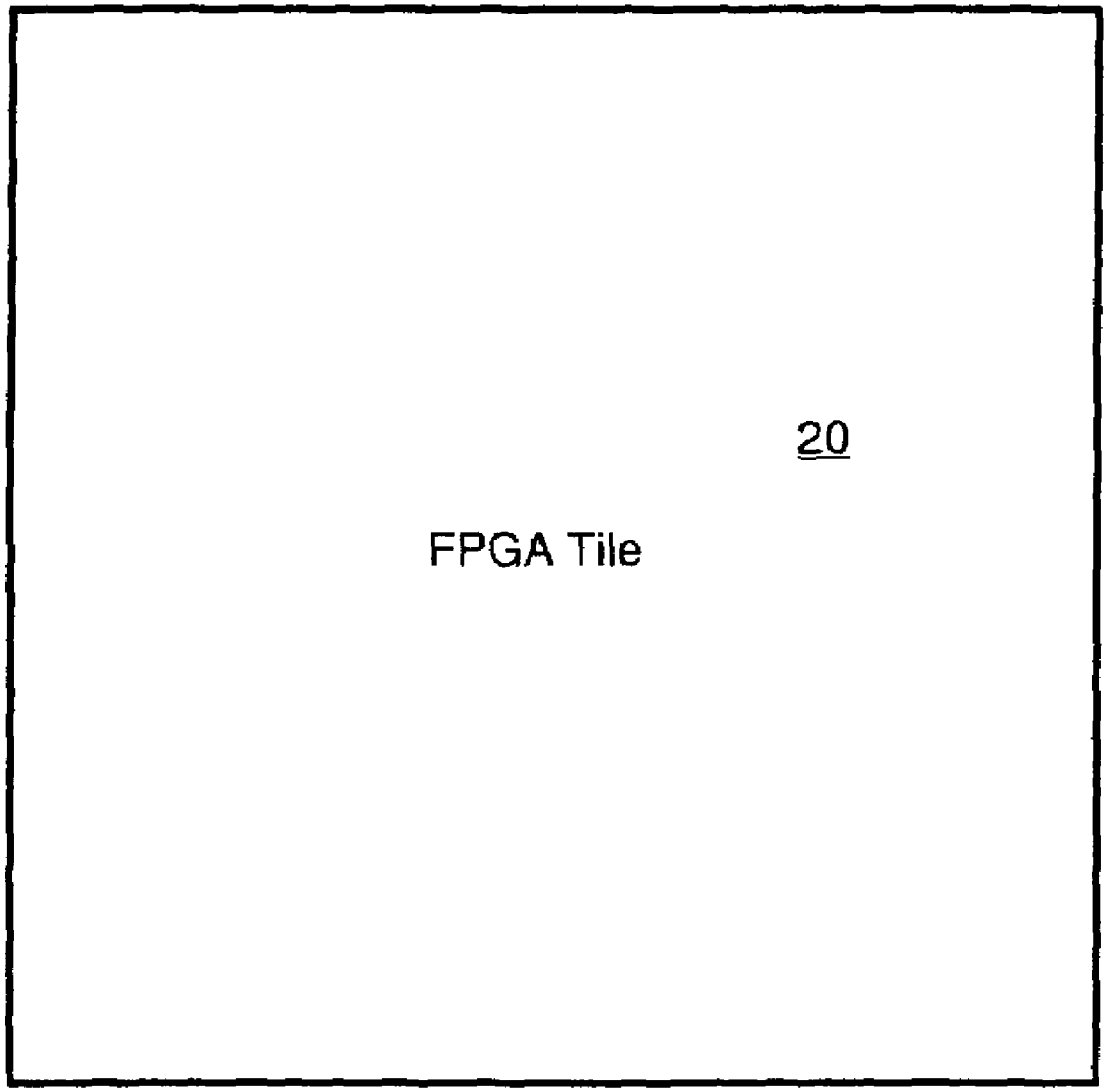
FIG. 1 is a block diagram illustrating an FPGA tile in accordance with the present invention.

Referring to FIG. 1, there is illustrated a field-programmable gate array (FPGA) tile 20 in accordance with the present invention. The FPGA tile 20 overcomes many of the disadvantages of conventional FPGAs in that it can be easily adapted for use in both integrated circuits (ICs) requiring large FPGAs and ICs requiring small FPGAs. Furthermore, the FPGA tile 20 can be used where the FPGA is to be manufactured as its own IC and where the FPGA is to be embedded into a larger IC (e.g., a system on a chip (SOC)).

Figure 2:
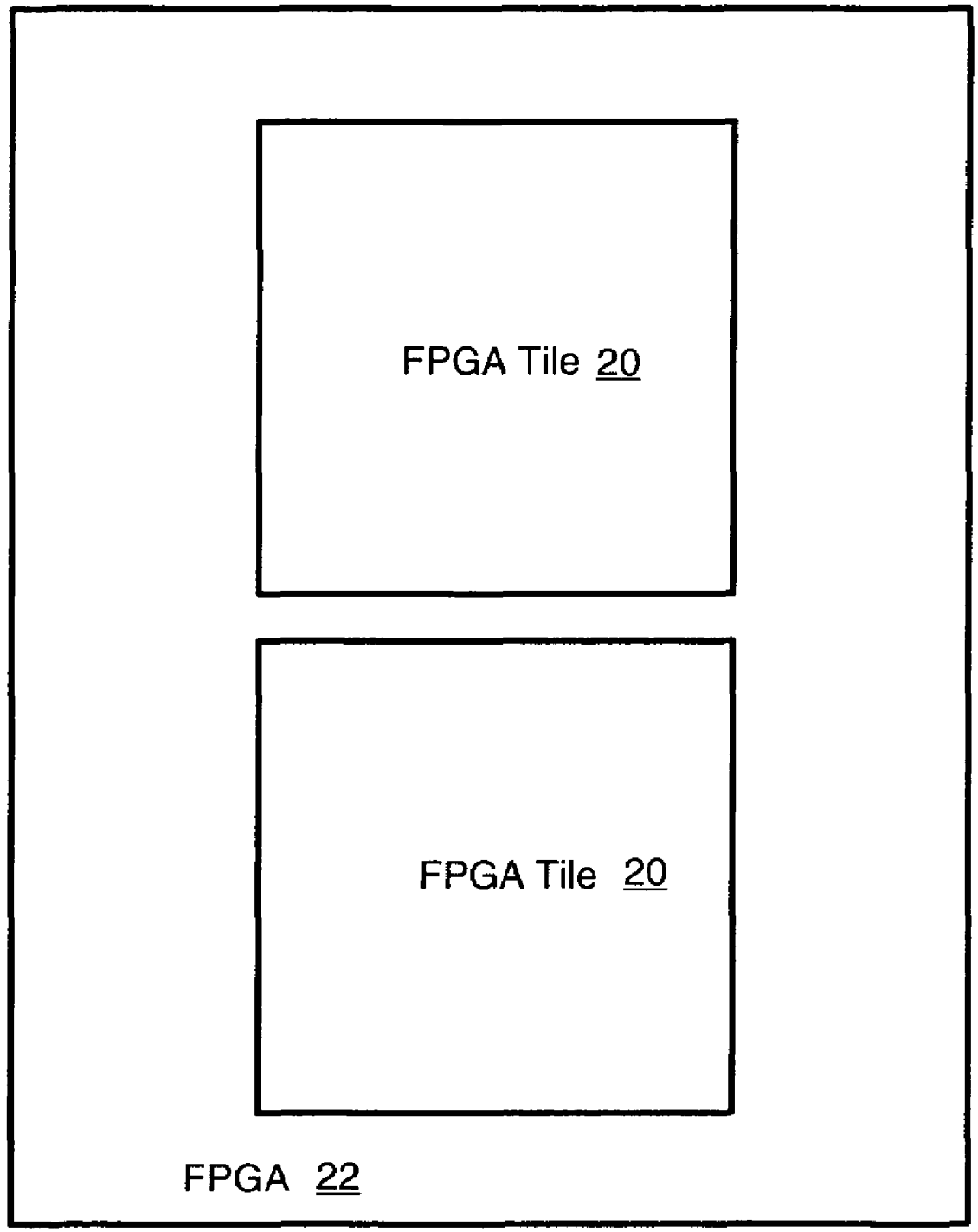
FIGS. 2, 3A, 3B and 4 are block diagrams illustrating various configurations of FPGA tiles in accordance with the present invention.
Figure 3A:
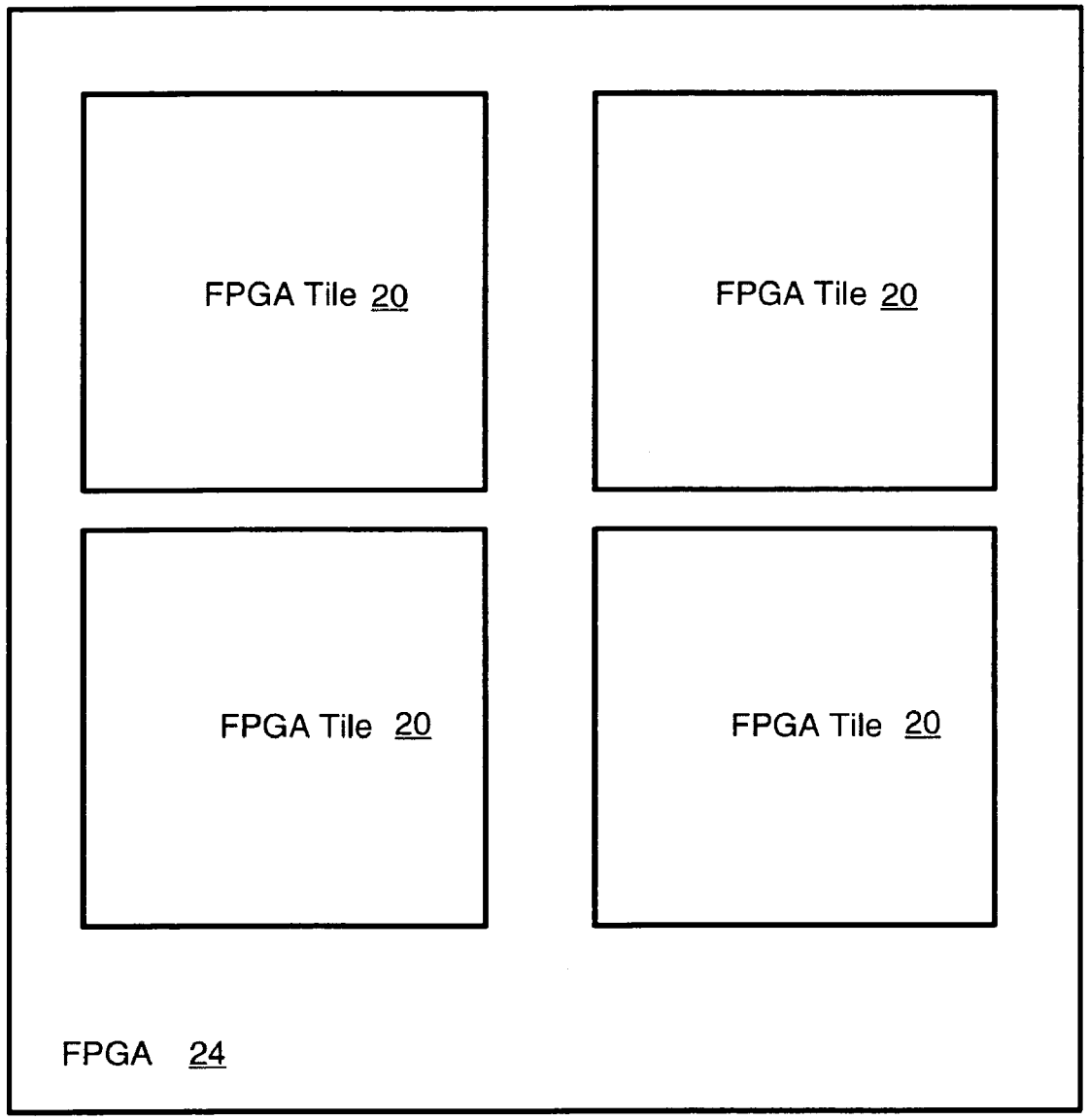

One feature of the FPGA tile 20 that makes it such a flexible and adaptable device is that it is "tileable". As used herein, the term "tileable" means that the FPGA tile 20 can be combined with other FPGA tiles to form a larger FPGA. For example, FIG. 2 illustrates an FPGA 22 that is formed by combining two FPGA tiles 20. The two FPGA tiles 20 work together and communicate with each other to form the larger FPGA 22. It should be well understood that any number of FPGA tiles 20 may be combined in accordance with the present invention to form a larger FPGA. For example, FIG. 3A illustrates an FPGA 24 that is formed by combining four FPGA tiles 20.

Figure 3B:
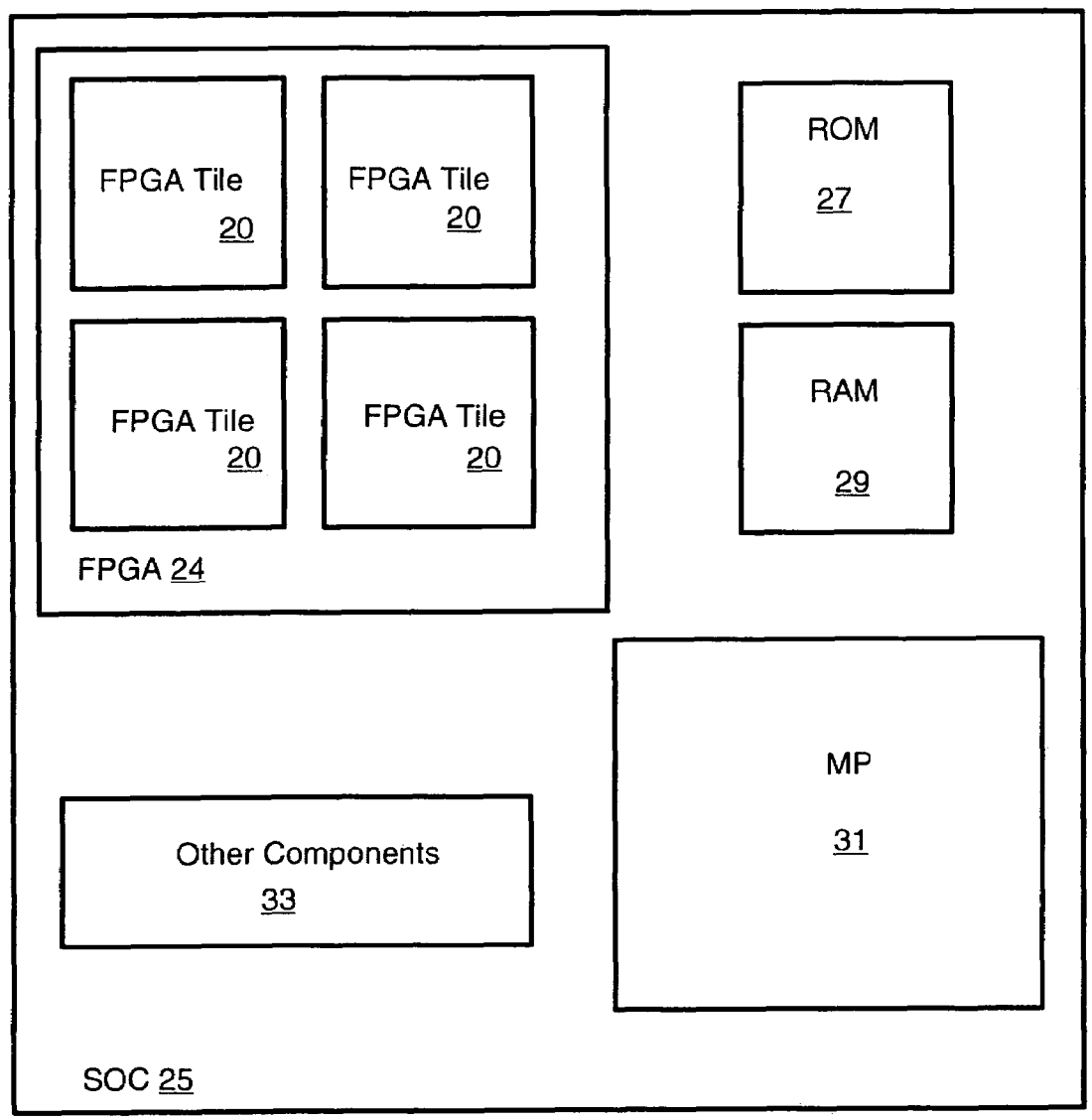
Figure 4:
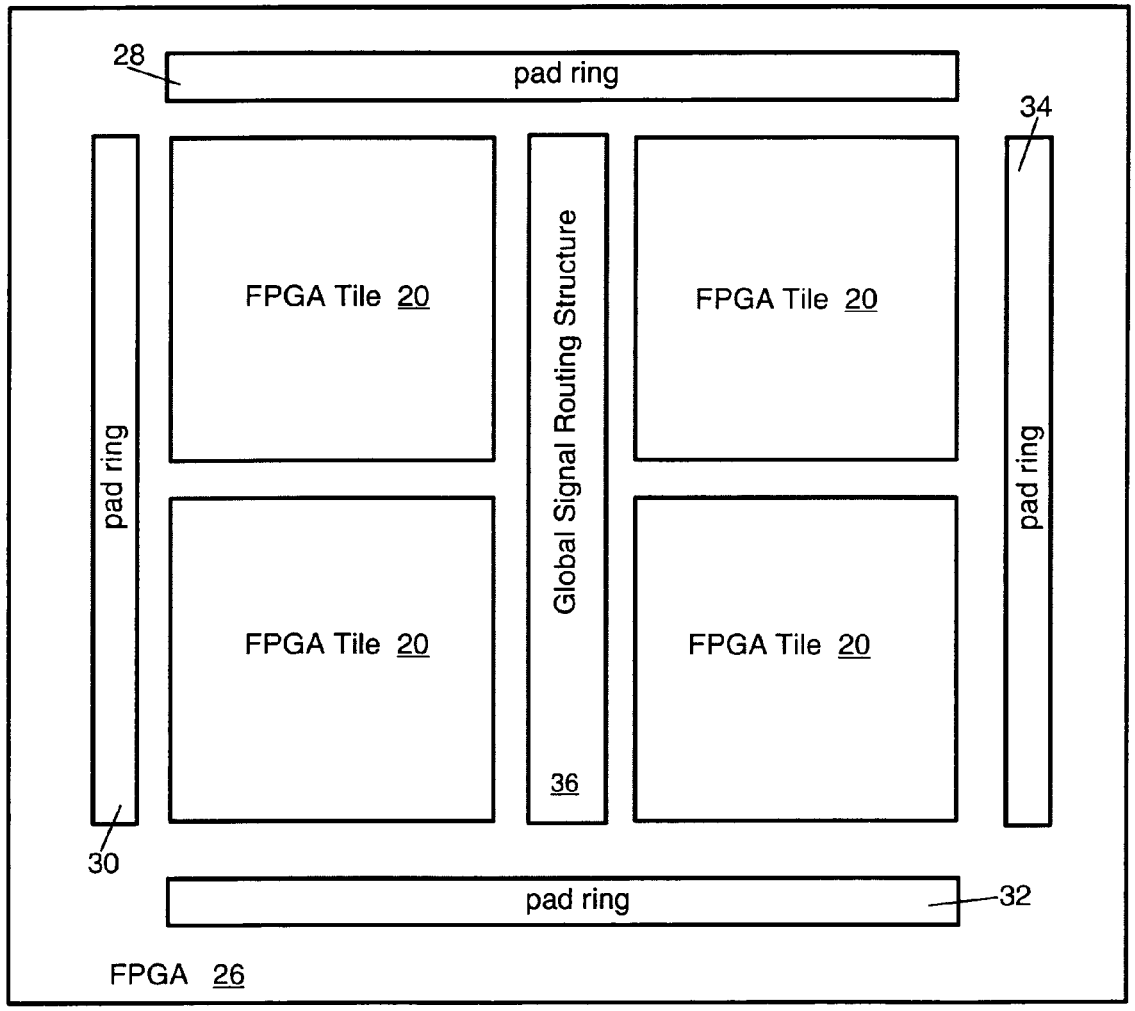

In accordance with the present invention, FPGA tiles 20 may be combined to form a larger FPGA that is to be manufactured as its own IC or that is to be embedded into a larger IC. For example, with respect to the later scenario, the FPGAs 22, 24 may be embedded into SOCs. FIG. 3B shows an SOC 25 having the FPGA 24 embedded therein. The SOC 25 includes several other components. The other components may include, for example, a read only memory (ROM) 27, a random access memory (RAM) 29, a microprocessor 31, and any other components 33. It should be well understood that the specific types of other components and the number of other components included on the SOC 25 will vary greatly depending on the particular application. With respect to the former scenario, FIG. 4 illustrates an FPGA 26 that has been manufactured as its own IC. Specifically, the FPGA 26 includes four FPGA tiles 20 and four pad rings 28, 30, 32, 34. The pad rings 28, 30, 32, 34 are used to couple the FPGA tiles 20 to the IC package pins of the FPGA 26.

Also illustrated in FIG. 4 is a global signal routing structure 36. The global signal routing structure 36, in general, is used to route inter-tile global signals between the FPGA tiles 20. It should be understood that the global signal routing structure 36 may be included in any combination of FPGA tiles 20, including for example the FPGAs 22, 24, in accordance with the present invention. Furthermore, the global signal routing structure 36 may be used whether the combined FPGA tiles 20 are manufactured as their own IC or embedded into a larger IC.

The FPGA tiles that are combined may be identical (as are the tiles in the FPGAs 22, 24, 26), or of different sizes and designs in accordance with the present invention. An advantage of using identical FPGA tiles is that it provides an economical solution for providing FPGAs having sizes that are appropriate for the intended uses/applications. Such a solution is economical because only one FPGA tile needs to be designed, and then the necessary number of tiles are combined to form an FPGA. Additionally, it should be understood that an "FPGA tile" is considered herein to be an FPGA. In other words, a single FPGA tile 20 can be used by itself to form an FPGA.

Figure 5:
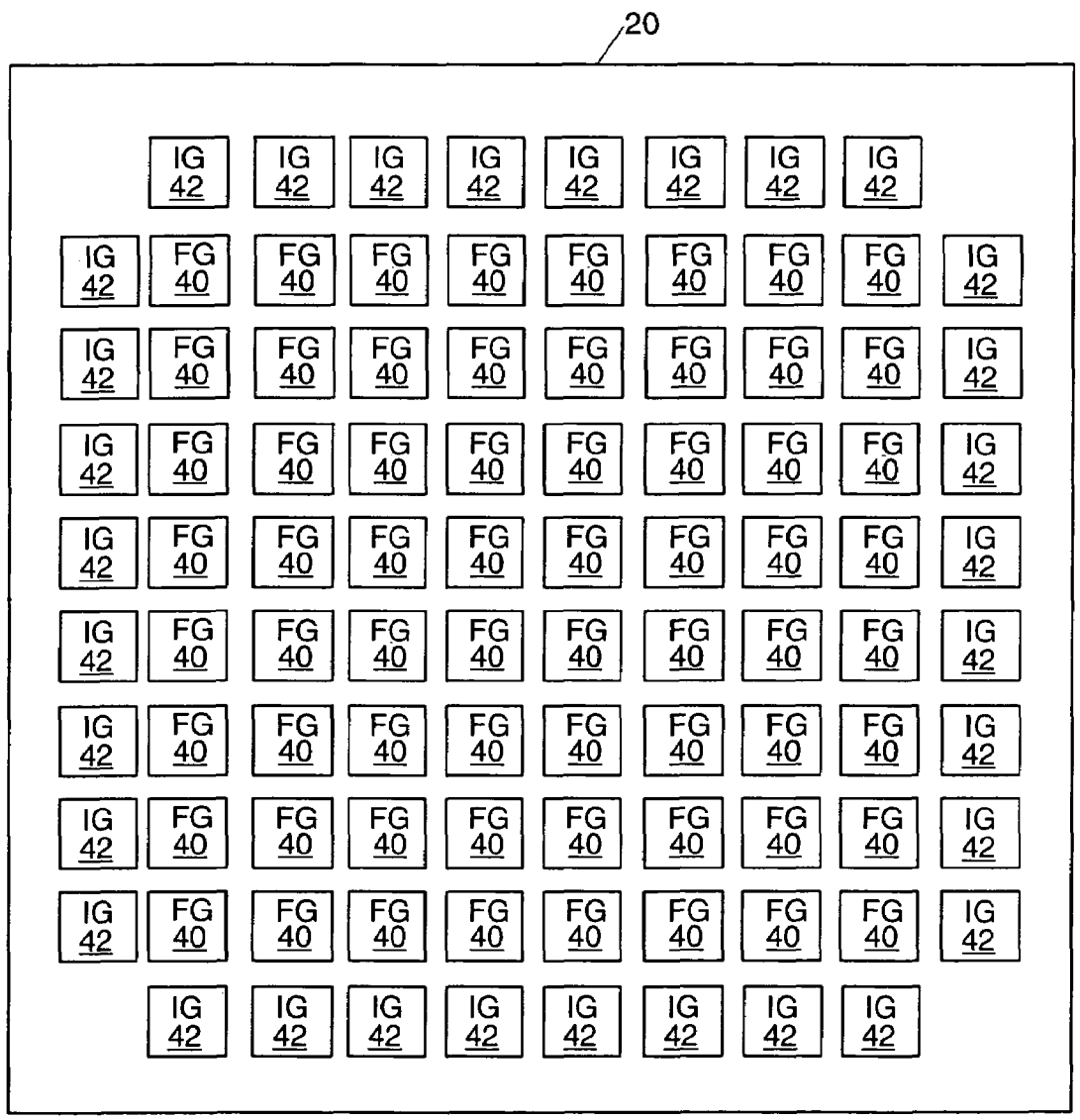
FIG. 5 is a block diagram illustrating in further detail the FPGA tile shown in FIG. 1.

Referring to FIG. 5, there is illustrated some of the internal components of the FPGA tile 20. Specifically, the FPGA tile 20 includes several functional groups (FGs) 40 that are surrounded by several interface groups (IGs) 42. The FGs 40 are small multifunction circuits that are capable of realizing many or all Boolean functions. The FGs 40 include look-up tables (LUTs) and other circuits capable of realizing Boolean functions, as well as memory cells that are used to configure logic functions such as addition, subtraction, etc. The IGs 42 are used for interfacing the FPGA tile 20 to other FPGA tiles or devices, or to pad rings for connecting the FPGA tile 20 to IC package pins. In general, the logic structure of the FPGA tile 20 is provided by the FGs 40 and the IGs 42.

Figure 6:
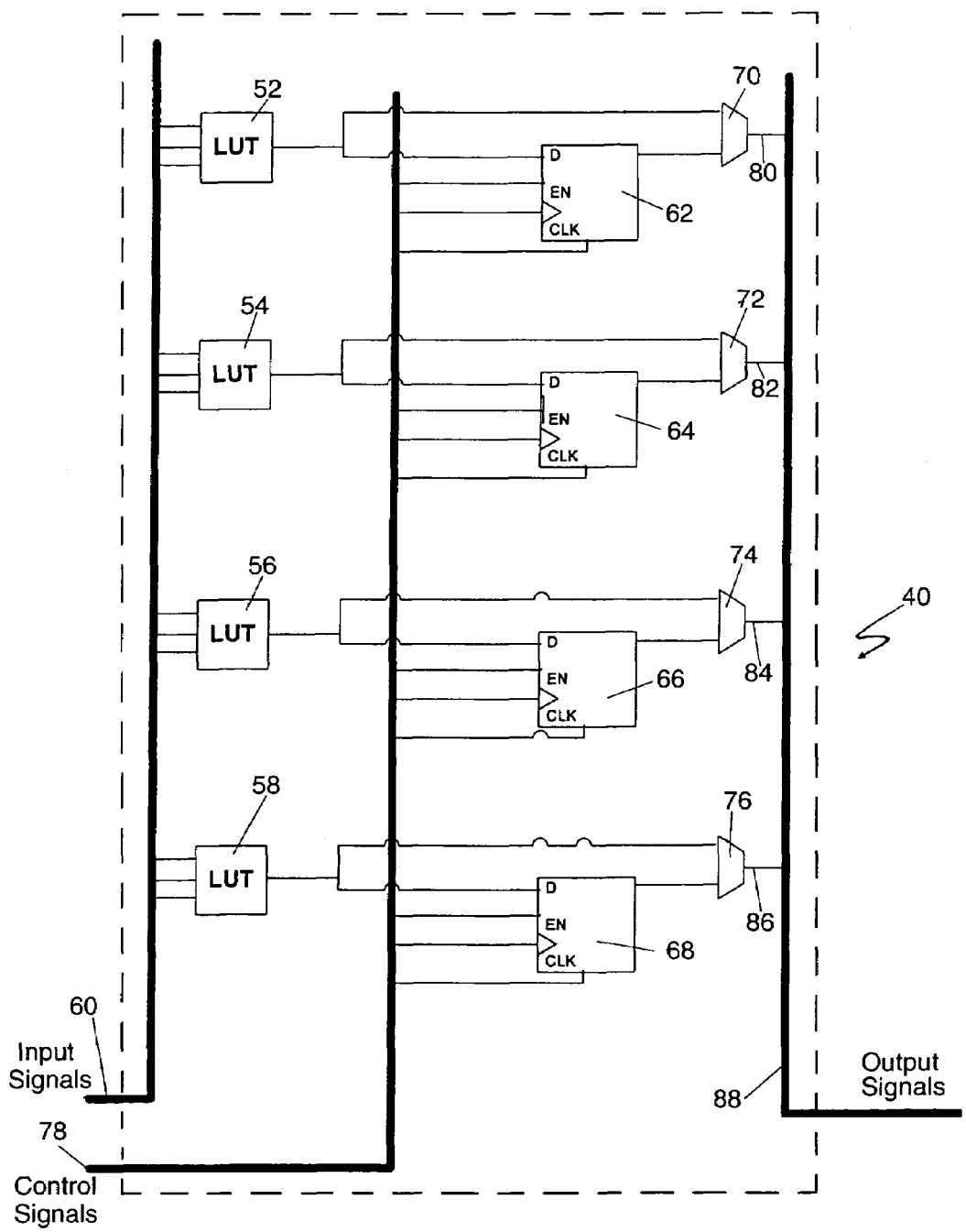
FIG. 6 is a schematic diagram of the architecture of a FPGA functional group.

FIG. 6 illustrates a functional group 40 of a FPGA tile 20. Functional group (FG) 40 is a small multifunction circuit that is capable of realizing many or all Boolean functions. FG 40 includes four look-up tables (LUTS) 52, 54, 56 and 58. Each LUT 52, 54, 56 and 58 includes three inputs which receive input signals 60. FG 40 also includes four registers 62, 64, 66 and 68. Specifically the D input of registers 62, 64, 66 and 68 is connected to the output of multiplexers 70, 72, 74 and 76. The clock, enable, set and reset inputs signals are connected to the corresponding control signals 78. One purpose of registers 62, 64, 66 and 68 is to store data of multiplexers 50, 52, 54 and 56. The inclusion of registers 62, 64, 66 and 68 add to the flexibility of the FPGA in that the output of FG 40 can be stored and used at a later time.

Still referring to FIG. 6, multiplexers 70, 72, 74 and 76 have inputs connected to at least one of the outputs of LUTS 52, 54, 56 and 58 and to at least one of the outputs of registers 62, 64, 66 and 68. Output lines 80, 82, 84 and 86 of multiplexers 70, 72, 74 and 76 are connected to output signal line 88.

Figure 7:
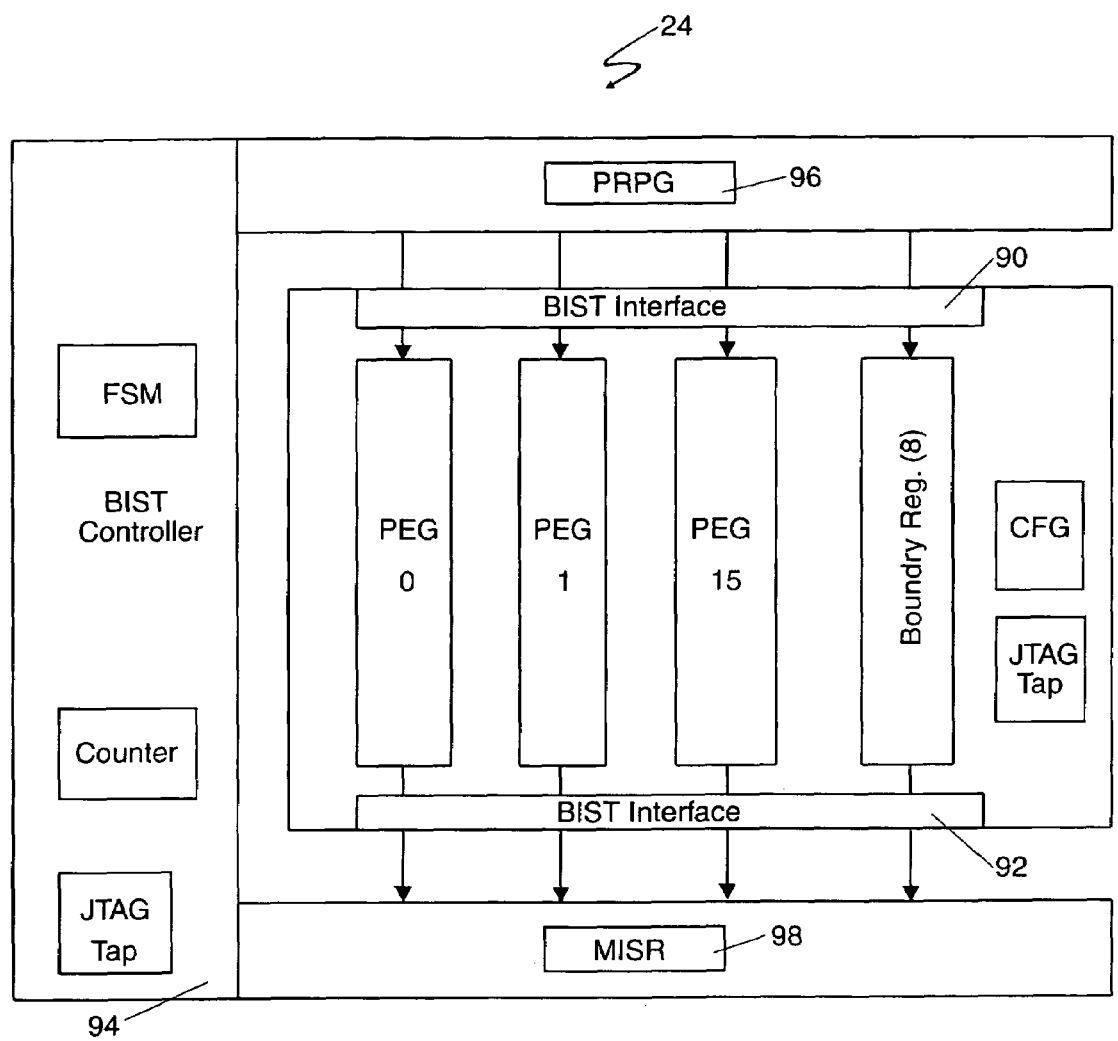
FIG. 7 is a block diagram of the architecture of a FPGA functional group with the BIST interface of the present invention.

FIG. 7 shows FPGA 24 with a built in self test (BIST) interface 90 and 92 added to FPGA 24 core. The BIST interface 90 and 92 is a parallel interface to the multiple serial scan chains. The BIST interface allows an external BIST controller 94 to control the scan chains implemented in FPGA tile 20. A typical BIST controller consists of a PRPG 96 random vector generation, a MISR 98 syndrome capture unit and control state machines. To avoid over complicating the disclosure, a more thorough description of built in self-test controllers is not provided herein.

BIST interface 90 and 92 uses a multiplexed scan system. The multiplexed scan system has minimal implementation cost because of the silicon area overhead of inserting a multiplexer is small compared to other scan methods. It should be well understood, however, that the multiplexed scan system is just one exemplary version of a scan system and that various versions of scan type systems may be used.

Figure 8:
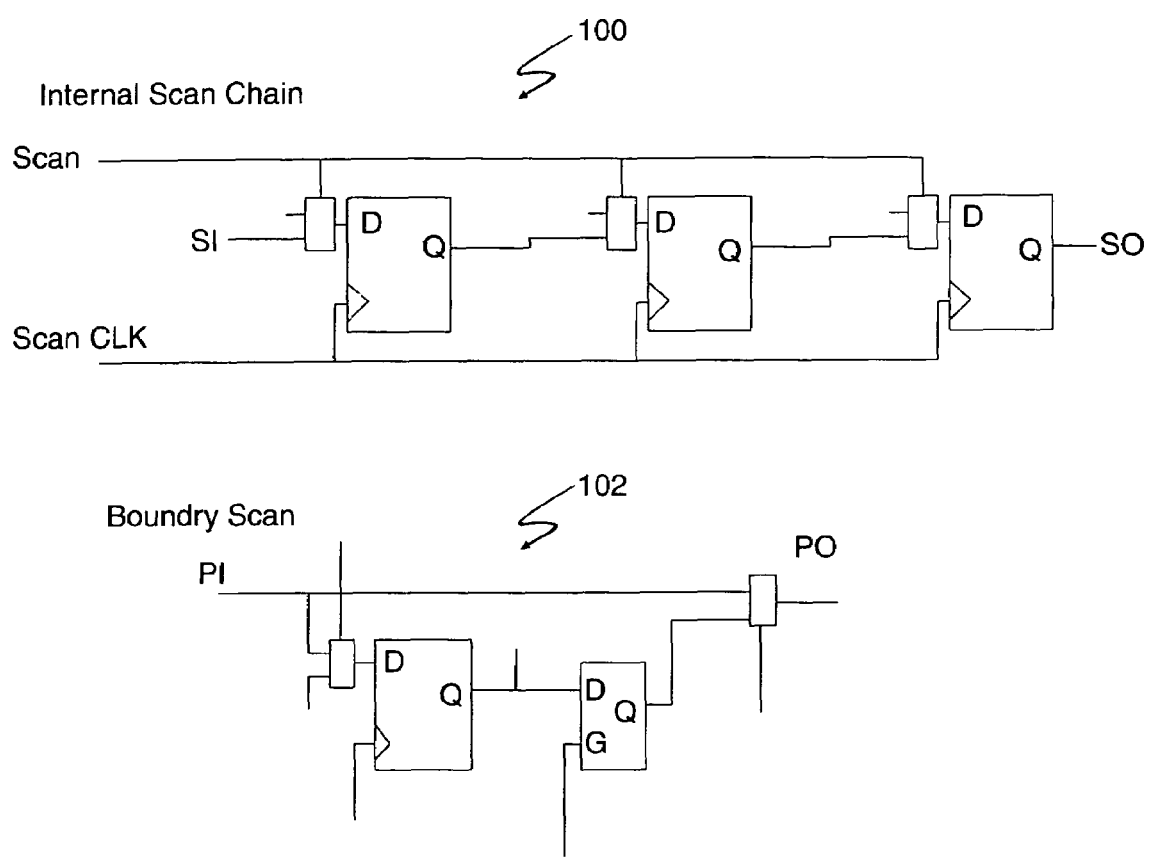
FIG. 8 is a schematic diagram of the internal scan chains and boundary scan chains of a FPGA tile shown in FIG. 1.
Figure 9:
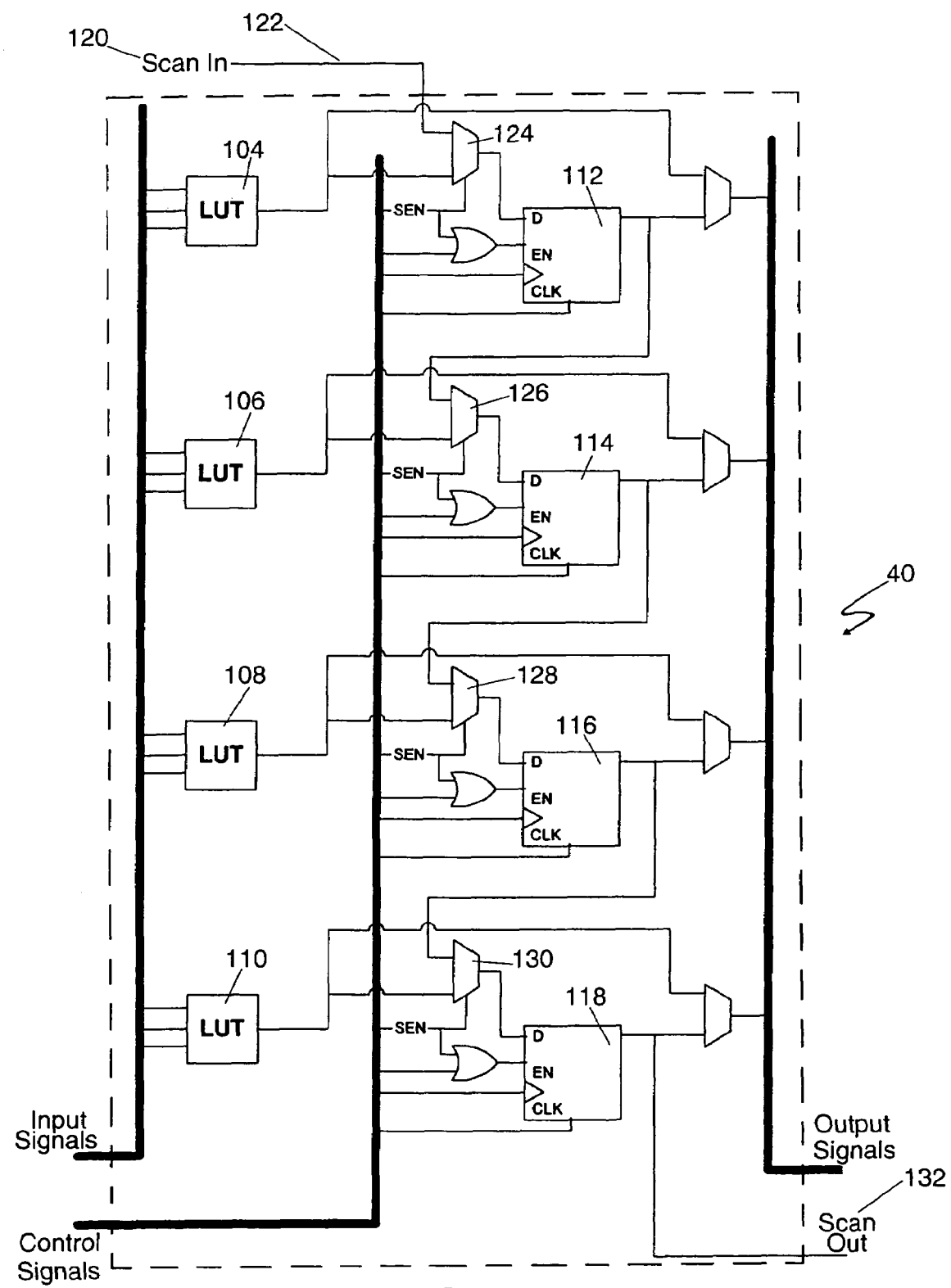
FIG. 9 is a schematic diagram of the architecture of a FPGA functional group with the scan chains superimposed.

FIGS. 8 and 9 illustrate the multiplexed scan system of BIST interface 92 and 92. As shown in FIGS. 7 and 8, BIST interface 90 and 92 allows access to internal scan chain 100 and boundary scan chain 102. The scan chains that scan the inputs and outputs make use of the boundary scan that is already implemented on the core to provide the access port (JTAG) for FPGA 24. BIST interface 90 and 92 is needed to control both the internal and boundary scan chains as shown in FIG. 7. When BIST interface 90 and 92 is enabled (TM=1), the control of the scan elements is switched from the JTAG controller to the BIST interface 90 and 92. A clock (BSCLK) is provided along with boundary scan chain mode (BSMODE), shift (BSSHIFT) and update (BSUPDATE) inputs. The provision for separate shift controls for the inputs and outputs prevents unknown values from entering the scan chain during the BIST capture cycle. Finally, as discussed more thoroughly below, scan data in (BSDATAIN) and scan data out (BSDATAOUT) signals are provided. The number of scan chains are chosen such that the maximum scan chain length is similar to the internal scan chains. For illustrative purposes only, the JTAG boundary ring is approximately 1400 cells in length, it could be split into 8 scan chains that vary between 100 and 256 cells in length.

FIG. 9 illustrates FG 40 with scan chains superimposed. As illustrated, when the FG 40 is in scan mode, the FPGA makes available SCANIN, SCANOUT and SCANEN connections to the internal scan chains. When the user asserts SCANEN all registers 112, 114, 116 and 118 are placed in scan chain mode. As shown, when in scan mode, all the scan chains are initiated allowing parallel scanning of FG 40. Scan In 120 initiates scan chain 122 which connects registers 112, 114, 116 and 118 and multiplexers 124, 126, 128 and 130 terminates at Scan Out 132. Typically, a user does not have access to the scan chains.

Figure 10A:
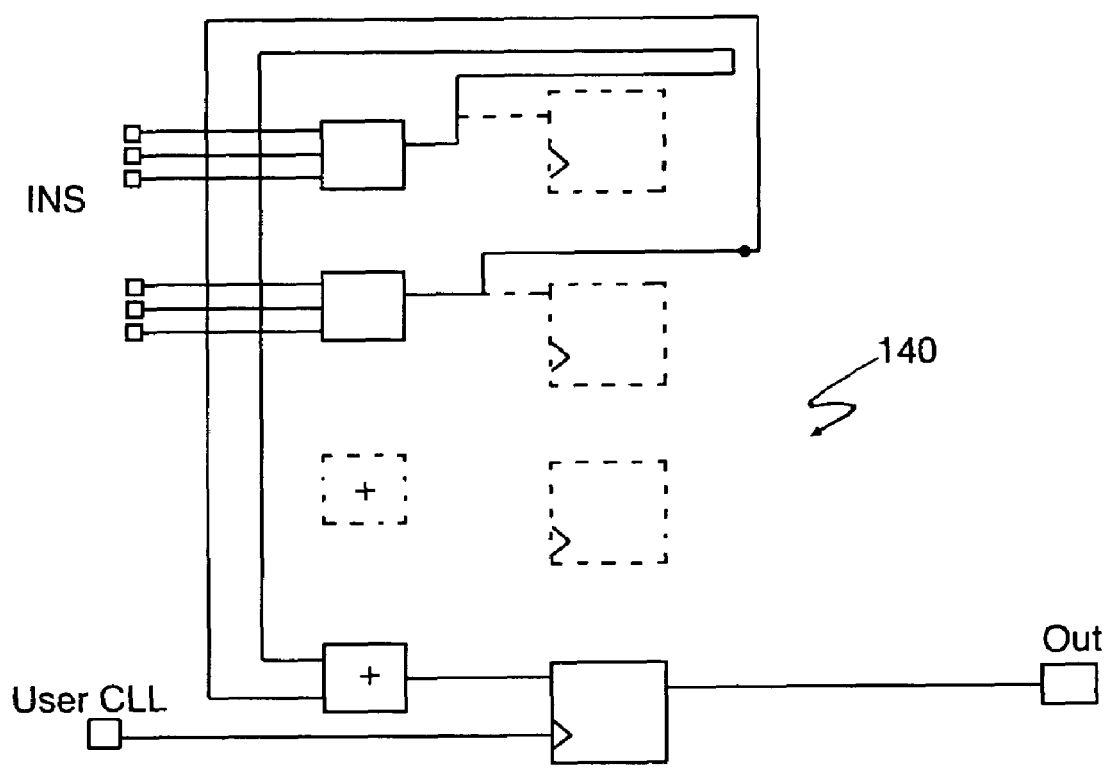
FIG. 10a is a schematic diagram of a user circuit in a FPGA functional group.
Figure 10B:
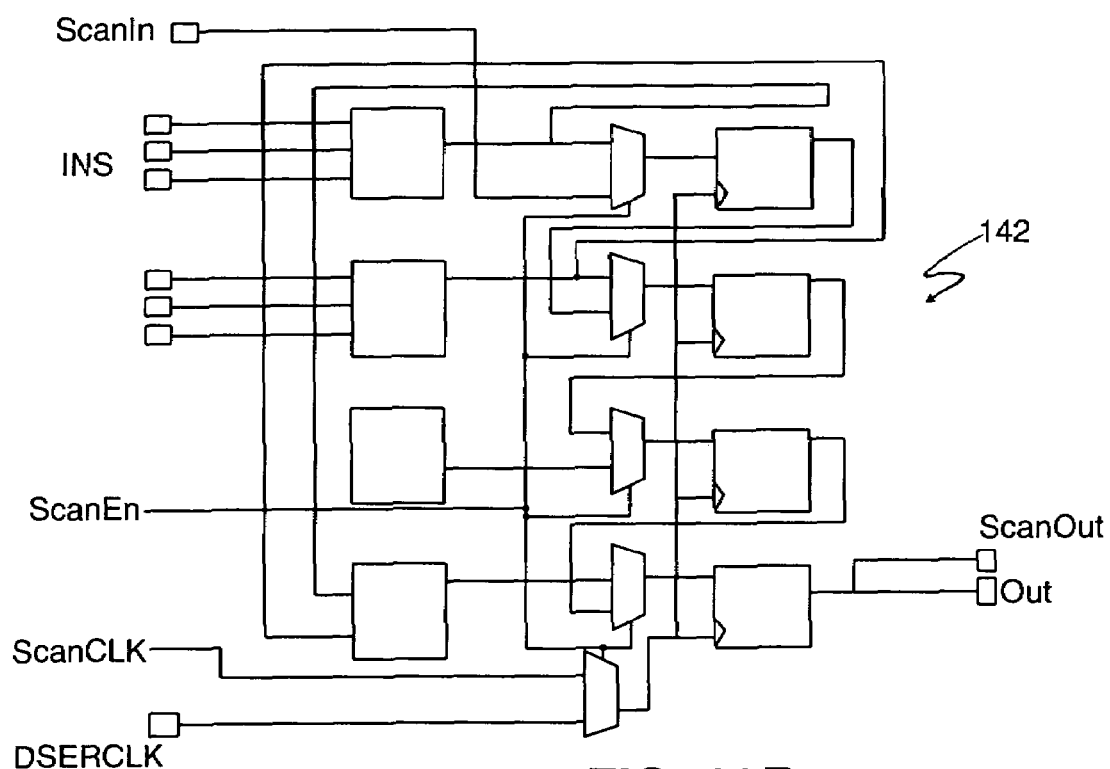
FIG. 10b is a schematic diagram of a user circuit in a FPGA functional group with the scan chain superimposed.

FIG. 10a illustrates a possible user circuit 140. A typical user design does not use all registers. However, the internal scan chain 46, as illustrated in FIG. 9, connects to all registers 112, 114, 116 and 118. One complication here is that the scan chain will scan registers that do not perform as part of the circuit and thus producing a false test reading. FIG. 3b illustrates a possible user circuit 142 with the scan chain superimposed.

To overcome the problem caused by the difference in the user circuit verses the actual circuit, the present invention inserts dummy registers that do not perform as part of the user circuit into the netlist so that the netlist is equivalent to the silicon routed scan chain.

Figure 11:
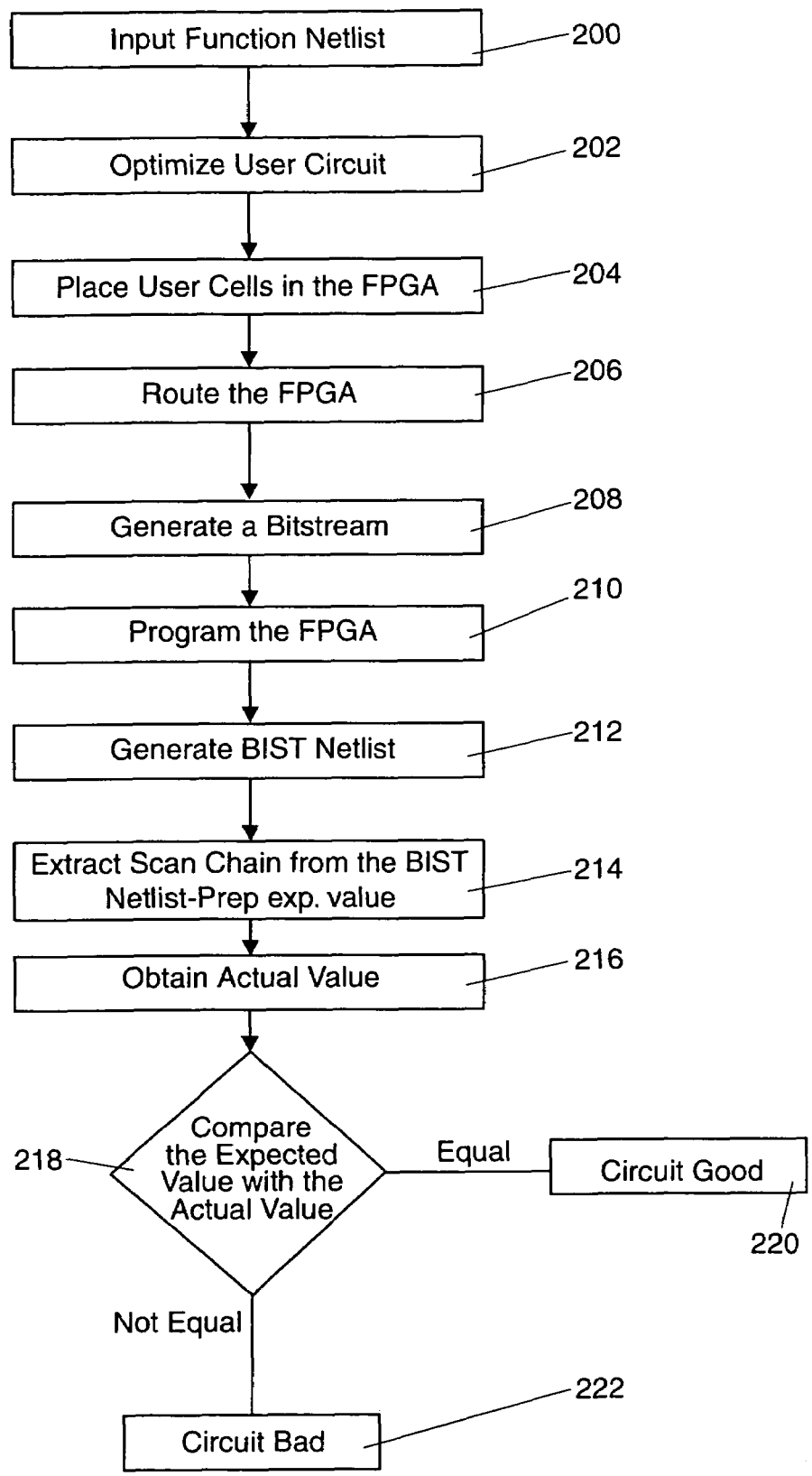
FIG. 11 is a flowchart illustrating one embodiment of the disclosed method.

FIG. 11 shows a simplified schematic of the disclosed method. Specifically, FIG. 4 discloses a method of accessing the scan chains in a FPGA that consists of plurality of functional groups. The process begins with inputing a function netlist 200 that defines a user circuit. Next, the user circuit is optimized 202. The user circuit is optimized to produce optimal mapping to the FPGA architecture. At step 204, all the cells in the users circuit are placed into the FPGA functional unit. At step 206, the system defines the routing structure to interconnect the functional units which will implement the user circuit. Next, the programming bitstream is generated at step 208. Once the programming bitstream is generated 208, the bitstream programs the FPGA functional unit 210.

Next, a Built-in Self Test ("BIST") netlist is generated 212. The BIST netlist overlays the device scan chains on top of the user function. As stated previously, the user circuit does not always use all registers in a functional group or unit. Thus, the BIST netlist replaces all user registers with scan registers with the scan chain routed as the physical silicon scan chains. Following the generation of the BIST netlist, the scan chain is extracted from the BIST netlist and expected syndrome values are predicted at step 214.

Next, at step 216 the scan chain is applied to the FPGA and actual syndrome values are obtained. Once the expected syndrome values are obtained the expected syndrome values are compared with the actual syndrome values 218. If the values are equal, the circuit is functioning correctly 220 and no further testing is necessary. If, however, the values are not equal, the circuit is not functioning correctly 222 and further diagnostics must be conducted.

It should be understood that various alternatives to the embodiments of the disclosed method and apparatus descried herein maybe employed in practicing the disclosed method and using the disclosed apparatus. It is intended that the following claims define the scope of the disclosed method and apparatus and that methods and structures within the scope of these claims and their equivalents be covered thereby.

What is claimed is:

1. A method of accessing the testing means in a Field Programmable Gate Array ("FPGA") comprised of a plurality of functional groups ("FGs") comprising:
   inputting a function netlist defining a user circuit;
   compiling said function netlist; and
   generating a logic Built-In Self Test ("BIST") netlist;
   wherein said BIST netlist replaces all user registers with scan registers with a scan chain routed as the physical silicon scan chains.

2. The method of claim 1 further comprising extracting scan chain from said logic BIST netlist and predicting an expected value.

3. The method of claim 2 further comprising applying said scan chain to the FPGA and obtaining actual values.

4. The method of claim 3 further comprising:
   comparing said expected values with said actual values; and
   flagging error if said expected values are different than said actual values.

5. A method of accessing the testing means in a FPGA comprised of a plurality of functional groups comprising:
   inputting a function netlist defining a user circuit;
   optimizing said user circuit;
   placing user cells into said FPGA functional unit;
   defining routing structure to interconnect said functional units to implement said user circuit;
   generating a programming bitstream;
   programming said FPGA functional unit with said bitstream;
   generating a BIST netlist, wherein said BIST netlist replaces all user registers with scan registers with a scan chain routed as the physical silicon scan chains;
   extracting scan chain from said BIST netlist and predicting an expected value;
   apply scan chain to FPGA and obtaining the actual values;
   comparing said expected values with said actual values; and
   flagging error if said expected values are different than said actual values.

6. An apparatus for accessing the testing resources in a programmed FPGA employing internal scan chains comprising:
   means for generating a BIST netlist, wherein said BIST netlist replaces all user registers with scan registers with a scan chain routed as the physical silicon scan chains;
   means for extracting a scan chain from said BIST netlist and predicting an expected value;
   means for applying said scan chain to FPGA and obtaining actual values; and
   means for comparing said expected values with said actual values.

* * * * *